United States Patent
Shibata et al.

(10) Patent No.: US 9,620,703 B2
(45) Date of Patent: Apr. 11, 2017

(54) PIEZOELECTRIC THIN-FILM ELEMENT, PIEZOELECTRIC SENSOR AND VIBRATION GENERATOR

(71) Applicant: SUMITOMO CHEMICAL COMPANY, LIMITED, Tokyo (JP)

(72) Inventors: Kenji Shibata, Tsukuba (JP); Masaki Noguchi, Tsuchiura (JP); Kazufumi Suenaga, Tsuchiura (JP); Kazutoshi Watanabe, Tsuchiura (JP); Fumimasa Horikiri, Nagareyama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 250 days.

(21) Appl. No.: 14/212,821

(22) Filed: Mar. 14, 2014

(65) Prior Publication Data
US 2014/0285068 A1   Sep. 25, 2014

(30) Foreign Application Priority Data

Mar. 19, 2013 (JP) .................................. 2013-056521
Jan. 22, 2014 (JP) .................................. 2014-009043

(51) Int. Cl.
H01L 41/08 (2006.01)
H01L 41/047 (2006.01)
(Continued)

(52) U.S. Cl.
CPC ........ *H01L 41/0805* (2013.01); *B06B 1/0644* (2013.01); *H01L 41/047* (2013.01);
(Continued)

(58) Field of Classification Search
CPC .... H01L 41/187; H01L 41/18; H01L 41/1873
(Continued)

(56) References Cited

U.S. PATENT DOCUMENTS 6,403,160 B1 * 6/2002 Koiwa .............. C04B 35/62218
                                                252/62.9 PZ
7,482,736 B2   1/2009 Ueno et al.
(Continued)

FOREIGN PATENT DOCUMENTS

JP   2007-184513 A   7/2007
JP   2008-159807 A   7/2008

OTHER PUBLICATIONS

Kenji Shibata et al. "Improvement of Piezoelectric Properties of (K, Na)NbO$_3$ Films Deposited by Sputtering", Japanese Journal of Applied Physics 50 (2011) 041503.

*Primary Examiner* — Shawki S Ismail
*Assistant Examiner* — Bryan Gordon
(74) *Attorney, Agent, or Firm* — McGinn IP Law Group, PLLC.

(57) ABSTRACT

A piezoelectric thin-film element includes a substrate, a lower electrode layer formed on the substrate, a piezoelectric thin-film layer that is formed on the lower electrode layer and includes potassium sodium niobate having a perovskite structure represented by the composition formula of $(K_{1-x}Na_x)NbO_3$ ($0.4 \leq x \leq 0.7$), and an upper electrode layer formed on the piezoelectric thin-film layer. The piezoelectric thin-film layer is formed such that a value of $(Ec^-+Ec^+)/2$ is not less than 10.8 kV/cm and a value of $(Pr^-+Pr^+)/2$ is not more than $-2.4$ $\mu C/cm^2$ where $Ec^-$ and $Ec^+$ are intersection points of a polarization-electric field hysteresis loop and the x-axis indicating an electric field and $Pr^-$ and $Pr^+$ are intersection points of the polarization-electric field hysteresis loop and the y-axis indicating polarization.

20 Claims, 8 Drawing Sheets

(51) Int. Cl.
  *H01L 41/187* (2006.01)
  *H01L 41/316* (2013.01)
  *B06B 1/06* (2006.01)
(52) U.S. Cl.
  CPC ...... *H01L 41/0477* (2013.01); *H01L 41/1873* (2013.01); *H01L 41/316* (2013.01)
(58) Field of Classification Search
  USPC .................................................. 310/358, 334
  See application file for complete search history.

(56) References Cited

U.S. PATENT DOCUMENTS

| | | |
|---|---|---|
| 8,063,543 B2 | 11/2011 | Shibata et al. |
| 2007/0126313 A1 | 6/2007 | Ueno et al. |
| 2007/0236104 A1* | 10/2007 | Fujii .................. B41J 2/161 310/358 |
| 2009/0102325 A1* | 4/2009 | Ozawa ................ C01G 23/003 310/358 |
| 2009/0189490 A1* | 7/2009 | Shibata ............... H01L 41/1873 310/360 |
| 2009/0236944 A1* | 9/2009 | Shibata ............... H01L 41/0805 310/358 |
| 2010/0225711 A1* | 9/2010 | Kato ................... B41J 2/14233 347/71 |
| 2010/0253749 A1* | 10/2010 | Arakawa ............ B41J 2/14233 347/68 |
| 2010/0320871 A1* | 12/2010 | Suenaga ............. C04B 35/495 310/330 |
| 2011/0187237 A1* | 8/2011 | Suenaga ............. H01L 41/187 310/363 |
| 2011/0316392 A1* | 12/2011 | Jeon .................... H03H 3/04 310/364 |

\* cited by examiner (a) EXAMPLE 1

(b) EXAMPLE 2

(c) EXAMPLE 4

(d) COMPARATIVE EXAMPLE 1

(e) COMPARATIVE EXAMPLE 5

PIEZOELECTRIC THIN-FILM ELEMENT, PIEZOELECTRIC SENSOR AND VIBRATION GENERATOR

The present application is based on Japanese patent application Nos. 2013-056521 and 2014-009043 filed on Mar. 19, 2013 and Jan. 22, 2014, respectively, the entire contents of which are incorporated herein by reference.

BACKGROUND OF THE INVENTION

1. Field of the Invention

The invention relates to a piezoelectric thin-film element, a piezoelectric sensor and a vibration generator.

2. Description of the Related Art

Piezoelectric materials are processed into various piezoelectric elements according to different purposes. The piezoelectric materials are widely used as functional electronic components, e.g., actuators for causing deformation of a piezoelectric element using applied voltage, piezoelectric sensors generating voltage by the deformation of the piezoelectric element, or vibration generators for generating power using vibration, etc., applied to the piezoelectric element.

Pb-containing perovskite-type ferroelectric materials having excellent piezoelectric properties and called PZT (lead zirconium titanate) are widely used as piezoelectric elements which are used for actuators and piezoelectric sensors, etc. Conventionally, a piezoelectric material layer of such a piezoelectric element is formed by a sintering process in which PZT as an oxide is sintered.

Currently, with the progress in downsizing and high performance of various electronic components, piezoelectric elements are also required to be downsized and to have higher performance. However, when the piezoelectric material layer of the piezoelectric element is formed by the sintering process, grains of crystal constituting the piezoelectric material layer become large and this causes a problem that variation and degradation in characteristics become pronounced in case that the piezoelectric material layer is formed to have a thickness of about 10 μm.

In order to solve such a problem, a method of forming a piezoelectric thin-film layer using thin-film technology has been studied as an alternative to the sintering process. For example, a piezoelectric thin-film element using a PZT piezoelectric thin-film layer formed on a Si substrate by a sputtering method has been put to practical use as a piezoelectric thin-film element for actuator or angular velocity sensor of high-speed high-definition inkjet printer head.

On the other hand, the piezoelectric thin-film element having the PZT piezoelectric thin-film layer contains about 60 to 70% of Pb. Therefore, in view of impact on living bodies and environment, it is desired to develop lead-free piezoelectric thin-film elements.

Some of such lead-free piezoelectric thin-film elements use a piezoelectric thin-film layer formed of KNN (potassium sodium niobate) represented by $(K_{1-x}Na_x)NbO_3$ (0<x<1) (see, e.g., JP-A-2007-184513 and JP-A-2008-159807). This KNN piezoelectric thin-film layer has a perovskite structure and shows promise as a highly possible lead-free piezoelectric thin-film element.

Meanwhile, it has been reported that a KNN piezoelectric thin-film element on a Si substrate by the sputtering method achieved a piezoelectric constant of $d_{31}=-100$ pm/V which is a practical level of the layer preferentially oriented to a (001) plane direction (Non-Patent Literature: Japanese Journal of Applied Physics 50(2011)041503).

SUMMARY OF THE INVENTION

When using a piezoelectric thin-film element for a piezoelectric sensor or a vibration generator, sensitivity of the piezoelectric sensor and power generation efficiency of the vibration generator are affected by relative permittivity of the piezoelectric thin-film layer and are more improved as the relative permittivity becomes smaller. Therefore, piezoelectric thin-film elements having a piezoelectric thin-film layer with a smaller relative permittivity are demanded.

However, the KNN piezoelectric thin-film layer described in the Non-patent literature has a problem that the relative permittivity thereof is as high as about 1000 even though the piezoelectric constant $d_{31}=-100$ pm/V is obtained.

It is an object of the invention to provide a piezoelectric thin-film element that can reduce the relative permittivity of a piezoelectric thin-film layer, as well as a piezoelectric sensor and a vibration generator each using the piezoelectric thin-film element.

(1) According to one embodiment of the invention, a piezoelectric thin-film element comprises:

a substrate;

a lower electrode layer formed on the substrate;

a piezoelectric thin-film layer that is formed on the lower electrode layer and comprises potassium sodium niobate having a perovskite structure represented by the composition formula of $(K_{1-x}Na_x)NbO_3$ (0.4≤x≤0.7); and an upper electrode layer formed on the piezoelectric thin-film layer, wherein the piezoelectric thin-film layer is formed such that a value of $(Ec^-+Ec^+)/2$ is not less than 10.8 kV/cm and a value of $(Pr^-+Pr^+)/2$ is not more than $-2.4$ μC/cm² where $Ec^-$ and $Ec^+$ are intersection points of a polarization-electric field hysteresis loop and the x-axis indicating an electric field and $Pr^+$ and $Pr^+$ are intersection points of the polarization-electric field hysteresis loop and the y-axis indicating polarization.

In the above embodiment (1) of the invention, the following modifications and changes can be made.

(i) The piezoelectric thin-film layer has a relative permittivity of not more than 490.

(ii) Piezoelectric displacement in the piezoelectric thin-film layer without polarization treatment occurs in a contraction direction in case of applying a positive electric field to the upper electrode layer and occurs in an elongation direction in case of applying a negative electric field to the upper electrode layer.

(iii) A substrate temperature during formation of the piezoelectric thin-film layer is in a range of 420 to 480° C.

(iv) A substrate temperature during formation of the piezoelectric thin-film layer is in a range of 420 to 520° C., and the formed piezoelectric thin-film layer is subjected to heat treatment at 410 to 500° C.

(v) The piezoelectric thin-film layer is formed of a pseudo-cubic crystal or a tetragonal crystal having a perovskite structure and preferentially oriented to a (001) plane direction, and a rate of orientation in the (001) plane direction is not less than 95%.

(vi) The piezoelectric thin-film layer is subjected to stress in a compression direction from the lower electrode layer or the substrate.

(vii) The lower electrode layer comprises Pt preferentially oriented to a (111) plane direction.

(2) According to another embodiment of the invention, a piezoelectric sensor comprises the piezoelectric thin-film element according to the above embodiment (1).

(3) According to another embodiment of the invention, a vibration generator comprises the piezoelectric thin-film element according to the above embodiment (1).

Effects of the Invention

According to one embodiment of the invention, a piezoelectric thin-film element can be provided that can reduce the relative permittivity of a piezoelectric thin-film layer, as well as a piezoelectric sensor and a vibration generator each using the piezoelectric thin-film element.

BRIEF DESCRIPTION OF THE DRAWINGS

Next, the present invention will be explained in more detail in conjunction with appended drawings, wherein.

DETAILED DESCRIPTION OF THE PREFERRED EMBODIMENT

Summary of Embodiment

A piezoelectric thin-film element in the present embodiment is provided with a substrate, a lower electrode layer formed on the Si substrate, a piezoelectric thin-film layer which is formed on the lower electrode layer and is formed of potassium sodium niobate having a perovskite structure represented by the composition formula of $(K_{1-x}Na_x)NbO_3$ ($0.4 \leq x \leq 0.7$), and an upper electrode layer, formed on the piezoelectric thin-film layer, wherein the piezoelectric thin-film layer is formed such that a value of $(Ec^-+Ec^+)/2$ is not less than 10.8 kV/cm and a value of $(Pr^-+Pr^+)/2$ is not more than $-2.4$ $\mu C/cm^2$ where $Ec^-$ and $Ec^+$ are intersection points of a polarization-electric field hysteresis loop and the x-axis indicating an electric field and $Pr^-$ and $Pr^+$ are intersection points of the polarization-electric field hysteresis loop and the y-axis indicating polarization.

Embodiment

Figure 1:
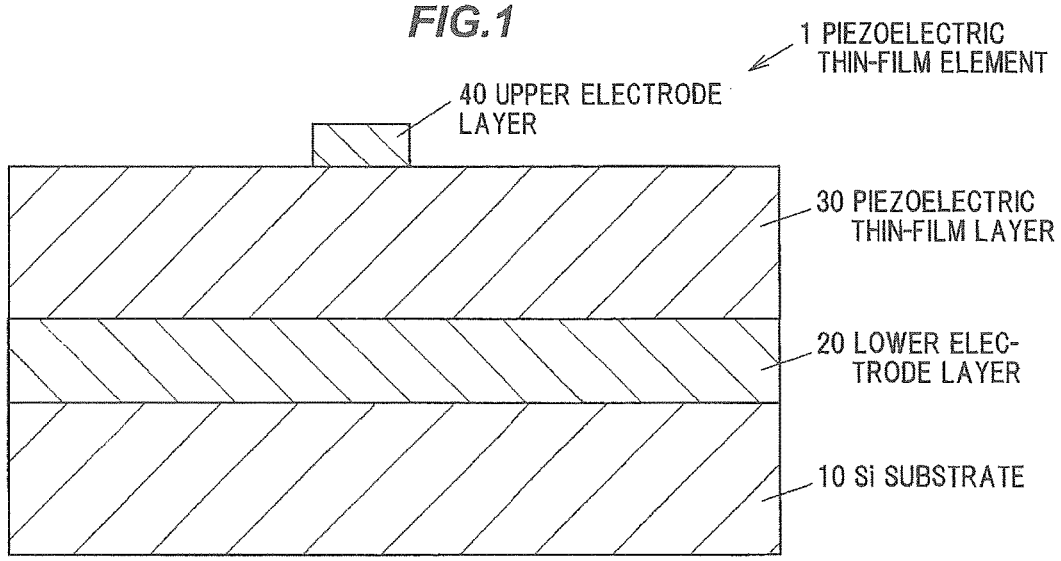
FIG. 1 is a cross sectional view showing a structure of a piezoelectric thin-film element in an embodiment of the present invention.

FIG. 1 is a cross sectional view showing a structure of a piezoelectric thin-film element in the embodiment of the invention. A piezoelectric thin-film element 1 is provided with a Si substrate 10 as an example of substrate, a lower electrode layer 20 formed on the Si substrate 10, a piezoelectric thin-film layer 30 formed on the lower electrode layer 20 and formed of KNN (potassium sodium niobate) represented by the composition formula of $(K_{1-x}Na_x)NbO_3$ ($0.4 \leq x \leq 0.7$), and an upper electrode layer 40 formed on the piezoelectric thin-film layer 30. The piezoelectric thin-film element 1 is used for, e.g., a piezoelectric sensor or a vibration generator.

Substrate

As a substrate of the piezoelectric thin-film element 1, it is possible to use a Si substrate having an oxide film on a surface thereof or an SOI (Silicon On Insulator) substrate, etc., besides the Si substrate 10. In addition, although a Si substrate having a surface oriented to, e.g., a (100) plane direction is used as the Si substrate 10, a Si substrate oriented to another plane direction may be used.

Lower Electrode Layer

The lower electrode layer 20 is formed on the Si substrate 10 by, e.g., a sputtering method. The lower electrode layer 20 is formed of Pt, Au or Al, etc. When using Pt for the lower electrode layer 20, it is preferable to form a Pt layer preferentially oriented to a (111) plane direction. Optionally, an adhesion layer of Ti, TiO or $TiO_2$, etc., may be provided between the Si substrate 10 and the lower electrode layer 20 in order to enhance adhesion between the Si substrate 10 and the lower electrode layer 20.

Piezoelectric Thin-Film Layer

The present inventors examined reduction in relative permittivity of a piezoelectric thin-film layer and found based on measurement of a polarization-electric field hysteresis loop and relative permittivity that it is possible to reduce relative permittivity of the piezoelectric thin-film layer 30 by shifting the polarization-electric field hysteresis loop toward a positive electric field direction.

Here, it is known that, in piezoelectric elements of $BaTiO_3$ ceramics sintered body and PZT ceramics sintered body manufactured by the conventional sintering process, an element, e.g., $Fe^{3+}$, contained in a raw material of the piezoelectric is substituted by $Ti^{4+}$ site of a main composition of the piezoelectric thin-film layer, such an element (to be negatively charged) and oxygen vacancies present in the ceramics (to be positively charged) then attract each other due to electrostatic attractive force and a defect complex is formed. The defect complex is called oxygen vacancy dipole. The oxygen vacancy dipole causes polarization pinning to occur in the $BaTiO_3$ ceramics sintered body and the PZT ceramics sintered body (restriction of polarization of the piezoelectric thin-film layer to a specific direction) and this causes a shift of the polarization-electric field hysteresis loop toward a positive electric field direction.

The piezoelectric thin-film layer 30 of the invention is formed of potassium sodium niobate having a perovskite structure represented by $(K_{1-x}Na_x)NbO_3$ (0.4≤x≤0.7), and is formed on the lower electrode layer 20 by, e.g., the sputtering method. The present inventors found that, in the KNN piezoelectric thin-film layer 30 formed by the sputtering method, something like oxygen vacancy dipole is formed in the piezoelectric thin-film layer 30 by influence of an electric field resulting from plasma generated in a sputtering system when a substrate temperature during formation of the piezoelectric thin-film layer 30 is set to much lower than the conventional technique (not less than 600° C.), and this causes polarization pinning in a depth direction to occur in the piezoelectric thin-film layer 30.

Furthermore, it was found that the optimal substrate temperature during the formation to cause polarization pinning is 420 to 480° C. and the formation in this temperature range allows the piezoelectric thin-film layer 30 to have a reduced relative permittivity of not more than 490.

In addition, it was also found that the relative permittivity of the piezoelectric thin-film layer 30 is reduced to not more than 490 when the piezoelectric thin-film layer 30 is formed at the substrate temperature in a range of 420 to 520° C. and is then subjected to heat treatment in a range of 410 to 500° C. for, e.g., 2 hours. Note that, the thickness of the piezoelectric thin-film layer 30 is preferably 1 to 4 μm from the viewpoint of downsizing of the piezoelectric thin-film element 1.

The piezoelectric thin-film layer 30 is formed of a pseudo-cubic crystal or a tetragonal crystal having a perovskite structure and preferentially oriented to a (001) plane direction, and a rate of orientation in the (001) plane direction is not less than 95%.

In the piezoelectric thin-film layer 30, a value of $(Ec^- + Ec^+)/2$ is not less than 10.8 kV/cm and a value of $(Pr^- + Pr^+)/2$ is not more than −2.4 μC/cm² where $Ec^-$ and $Ec^+$ are the intersection points of a polarization-electric field hysteresis loop and the x-axis indicating an electric field and $Pr^-$ and $Pr^+$ are the intersection points of the polarization-electric field hysteresis loop and the y-axis.

Furthermore, in the piezoelectric thin-film layer 30, piezoelectric displacement of 0.05 to 0.1 nm occurs when an electric field of 10 kV/cm is applied to the upper electrode layer in a state that the upper electrode layer 40 is not subjected to polarization treatment which is performed by applying an electric field of, e.g., −100 kV/cm. Piezoelectric displacement of the piezoelectric thin-film layer 30 occurs in a contraction direction (a negative displacement direction) in case of applying a positive electric field to the upper electrode layer 40 and occurs in an elongation direction (a positive displacement direction) in case of applying a negative electric field.

Upper Electrode Layer

The upper electrode layer 40 is a circular electrode formed on the piezoelectric thin-film layer 30 by a sputtering method or a vapor-deposition technique, etc. The upper electrode layer 40 is formed of Pt, Au or Al, etc. Optionally, an adhesion layer of Ti or Ta, etc. may be formed between the piezoelectric thin-film layer 30 and the upper electrode layer 40. In addition, the size of the upper electrode layer 40 is preferably in a range of 0.4 to 1 mm in diameter.

Effects of the Embodiment

The present embodiment achieves the following effects.

(1) It is possible to reduce relative permittivity of the piezoelectric thin-film layer 30 to not more than 490 by forming the piezoelectric thin-film layer 30 at the substrate temperature of 420 to 480° C. In addition, it is also possible to reduce relative permittivity of the piezoelectric thin-film layer 30 to not more than 490 when the piezoelectric thin-film layer 30 formed at the substrate temperature of 420 to 520° C. is subjected to heat treatment at 410 to 500° C.

(2) When the piezoelectric thin-film element 1 having the piezoelectric thin-film layer 30 is used for a piezoelectric sensor, sensitivity of the piezoelectric sensor can be improved due to the reduced relative permittivity of the piezoelectric thin-film layer 30. In addition, use of the piezoelectric thin-film element 1 for a vibration generator allows power generation efficiency of the vibration generator to be improved.

(3) As compared to a conventional piezoelectric thin-film layer which requires polarization treatment performed by applying an electric field of not more than 10 kV/cm, it is possible to obtain larger piezoelectric displacement without performing polarization treatment after forming the piezoelectric thin-film layer 30. In addition, it is possible to obtain piezoelectric displacement in a negative (positive) displacement direction by applying a positive (negative) electric field without performing polarization treatment.

(4) Since the polarization treatment of the piezoelectric thin-film layer 30 can be skipped, it is possible to simplify a manufacturing process of a device using the piezoelectric thin-film element 1 with the piezoelectric thin-film layer 30.

EXAMPLES

Next, Examples of the invention will be described in reference to FIGS. 2 to 6E and Table 1.

Method of Manufacturing Piezoelectric Thin-Film Elements in Examples 1 to 11 and Comparative Examples 1 to 9

Figure 2:
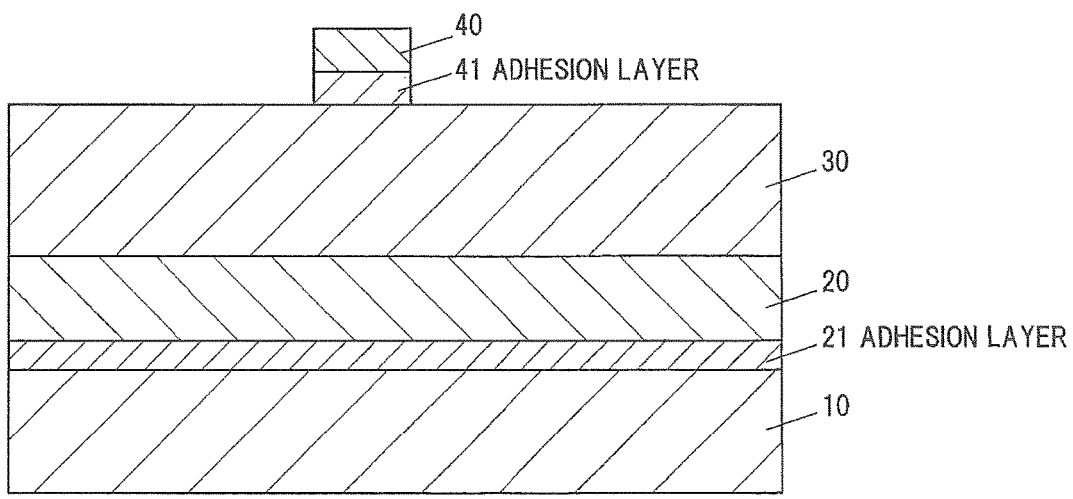
FIG. 2 is a cross sectional view showing a structure of piezoelectric thin-film elements in Examples 1 to 11 and Comparative Examples 1 to 9.

An example method of manufacturing the piezoelectric thin-film element 1 in Examples 1 to 11 and Comparative Examples 1 to 9 will be described in reference to FIG. 2. FIG. 2 is a cross sectional view showing a structure of piezoelectric thin-film elements in Examples 1 to 11 and Comparative Examples 1 to 9.

A Si substrate with an oxide film (surface oriented to a (100) plane direction, 0.525 mm in thickness, 4 inches (10.16 cm) in diameter and 200 nm in thickness of thermal oxide film) was used as the Si substrate 10 to be a substrate of the piezoelectric thin-film element 1 in Examples and Comparative Examples.

For manufacturing the piezoelectric thin-film element 1 in Examples and Comparative Examples, firstly, a Ti adhesion layer 21 (10 nm in thickness) was formed on the Si substrate 10 by RF magnetron sputtering process which is an example of the sputtering method. Next, a Pt lower electrode layer 20 (preferentially oriented to a (111) plane direction and having a thickness of 200 nm) was formed on the adhesion layer 21. The adhesion layer 21 and the lower electrode layer 20 are formed under the conditions of the substrate temperature at 350° C., RF magnetron discharge power at 300 W and pressure of Ar used as an introduced gas at 2.5 Pa. The adhesion layer 21 was deposited for 3 minutes and the lower electrode layer 20 was deposited for 10 minutes.

Next, using a $(K_{1-x}Na_x)NbO_3$ sintered body as a sputtering target, a $(K_{1-x}Na_x)NbO_3$ piezoelectric thin-film layer 30 was formed on the lower electrode layer 20 by the RF magnetron sputtering process. The piezoelectric thin-film layer 30 was formed under the conditions that the substrate temperature is in a range of 420 to 580° C., RF magnetron discharge power is 300 W, introduced gas pressure using Ar/O$_2$ (the Ar/O$_2$ ratio of 25:1) is 0.3 Pa and a distance between the sputtering target and the Si substrate 10 is 350 nm. In addition, the thickness of the piezoelectric thin-film layer 30 was adjusted to 2000 nm by intermittent formation in which a formation period and a non-formation period of the piezoelectric thin-film layer 30 are alternately repeated. The intermittent formation was performed under the condition that the formation period is 3 seconds (5 to 10 nm in film thickness of the piezoelectric thin-film layer 30) and the non-formation period is 3 seconds. As an evaluation result by X-ray diffraction, all samples of the piezoelectric thin-film layer 30 are preferentially oriented to the (001) plane direction and a rate of orientation in the (001) plane direction is not less than 95%.

Next, a Ti adhesion layer 41 having a diameter of 0.5 mm was formed on the piezoelectric thin-film layer 30. Then, a Pt upper electrode layer 40 having a diameter of 0.5 mm was formed on the adhesion layer 41. The adhesion layer 41 and the upper electrode layer 40 were formed by the RF magnetron sputtering process at room temperature and a liftoff process using a photoresist.

Next, each sample of Examples 6 to 11 and Comparative Examples 6 to 9 was subjected to heat treatment in the atmosphere at from 410 to 700° C. for 2 hours.

Examples 1 to 5 are samples which are formed at a temperature of the Si substrate (hereinafter, simply referred as "substrate temperature") in a range of 420 to 480° C. and are not subjected to heat treatment, and Examples 6 to 11 are samples which are formed at a substrate temperature in a range of 420 to 520° C. and are then subjected to heat treatment in a range of 410 to 500° C.

In addition, Comparative Examples 1 to 5 are samples which are formed at a substrate temperature in a range of 520 to 580° C. and are not subjected to heat treatment, and Comparative Examples 6 to 9 are samples which are formed at a substrate temperature in a range of 520 to 580° C. and are subjected to heat treatment in a range of 500 to 700° C.

Evaluation of Polarization-Electric Field Hysteresis Loop

Figure 3:
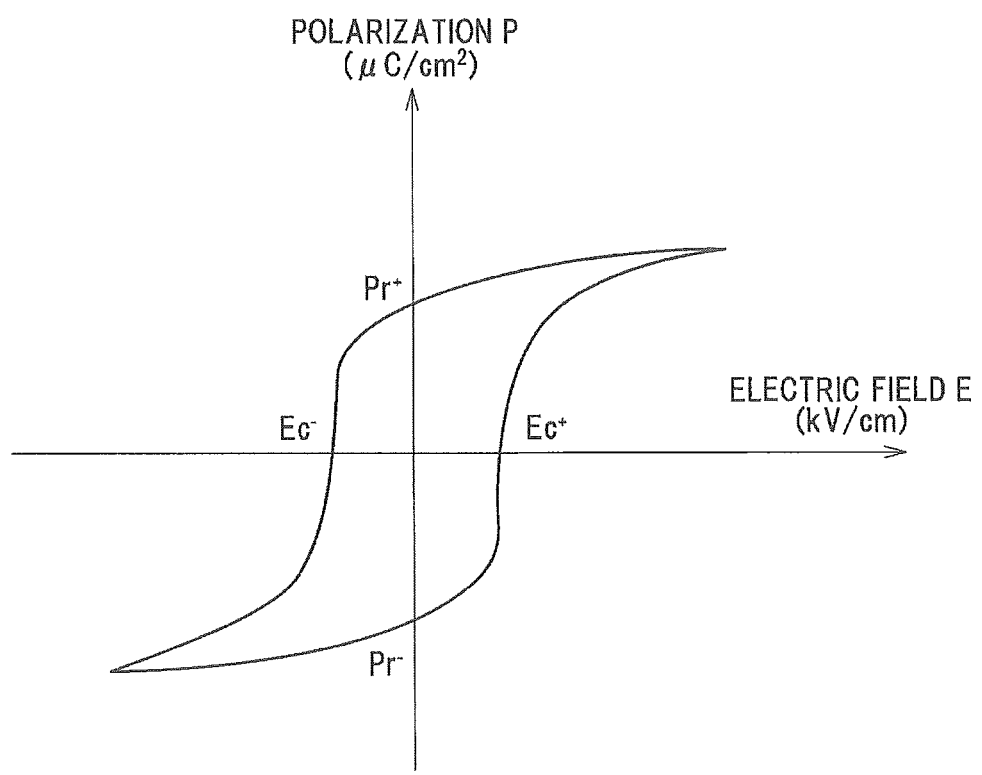
FIG. 3 is an exemplary diagram illustrating a polarization-electric field hysteresis loop.
Figure 4:
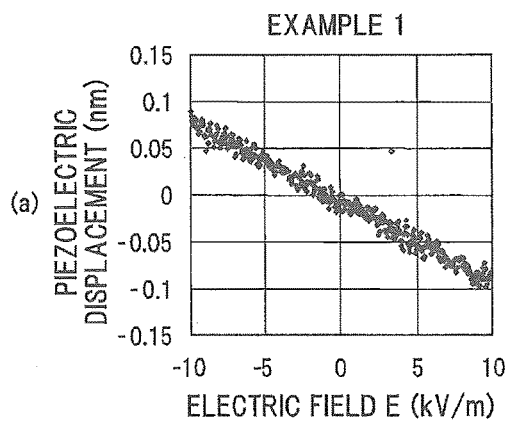
FIGS. 4A to 4E are characteristic diagrams illustrating piezoelectric displacement of a piezoelectric thin-film layer when an electric field of −10 to 10 kV/cm is applied to the piezoelectric thin-film element before polarization treatment, wherein FIGS. 4A to 4C respectively show Examples 1, 2 and 4 and FIGS. 4D and 4E respectively show Comparative Examples 1 and 5.
Figure 4:
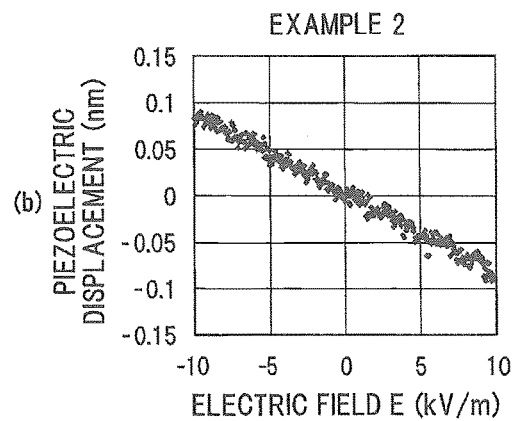
Figure 4:
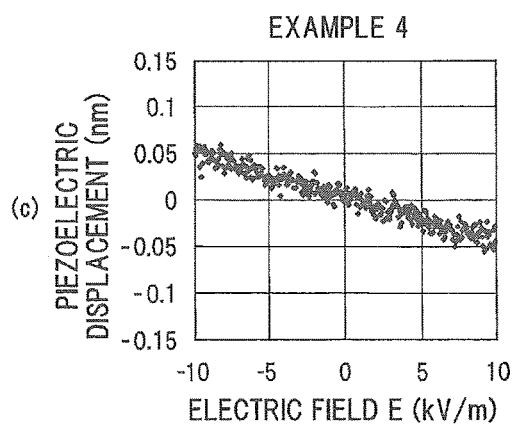
Figure 4:
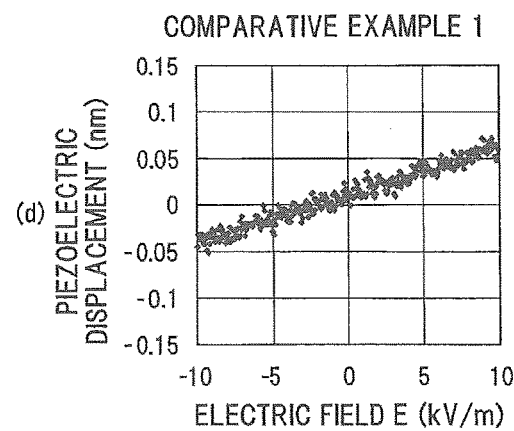
Figure 4:
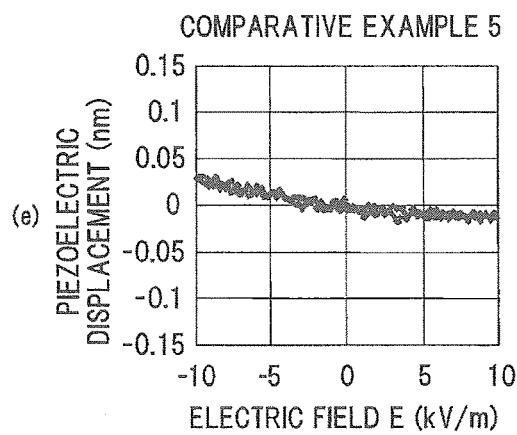
Figure 5:
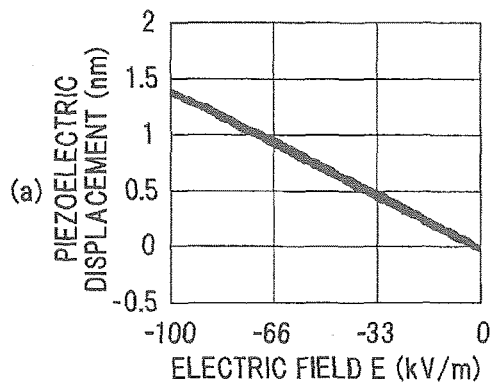
FIGS. 5A to 5E are characteristic diagrams illustrating piezoelectric displacement of the piezoelectric thin-film layer when the piezoelectric thin-film element is polarized by applying an electric field of −100 to 0 kV/cm, wherein FIGS. 5A to 5C respectively show Examples 1, 2 and 4 and FIGS. 5D and 5E respectively show Comparative Examples 1 and 5.
Figure 5:
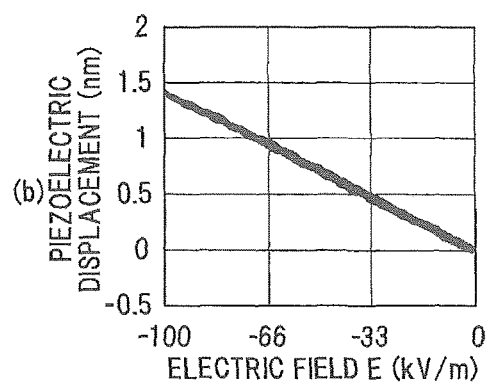
Figure 5:
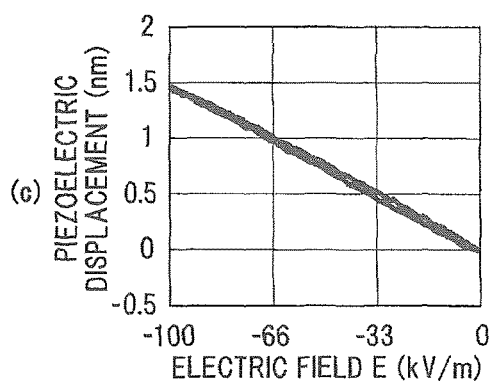
Figure 5:
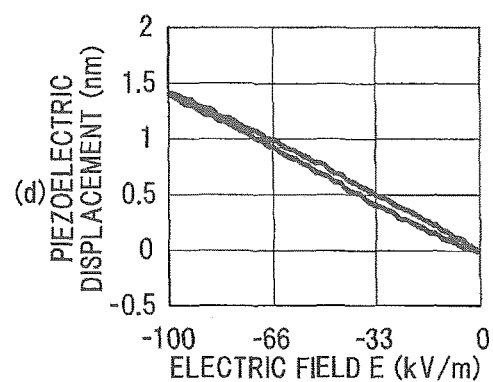
Figure 5:
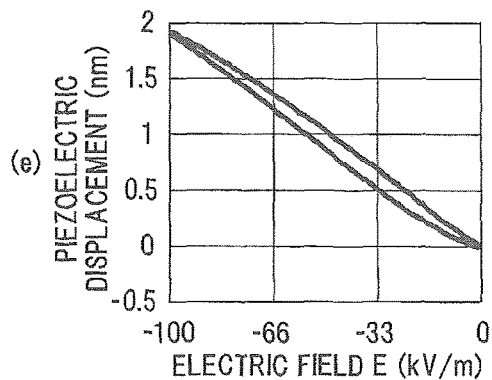
Figure 6:
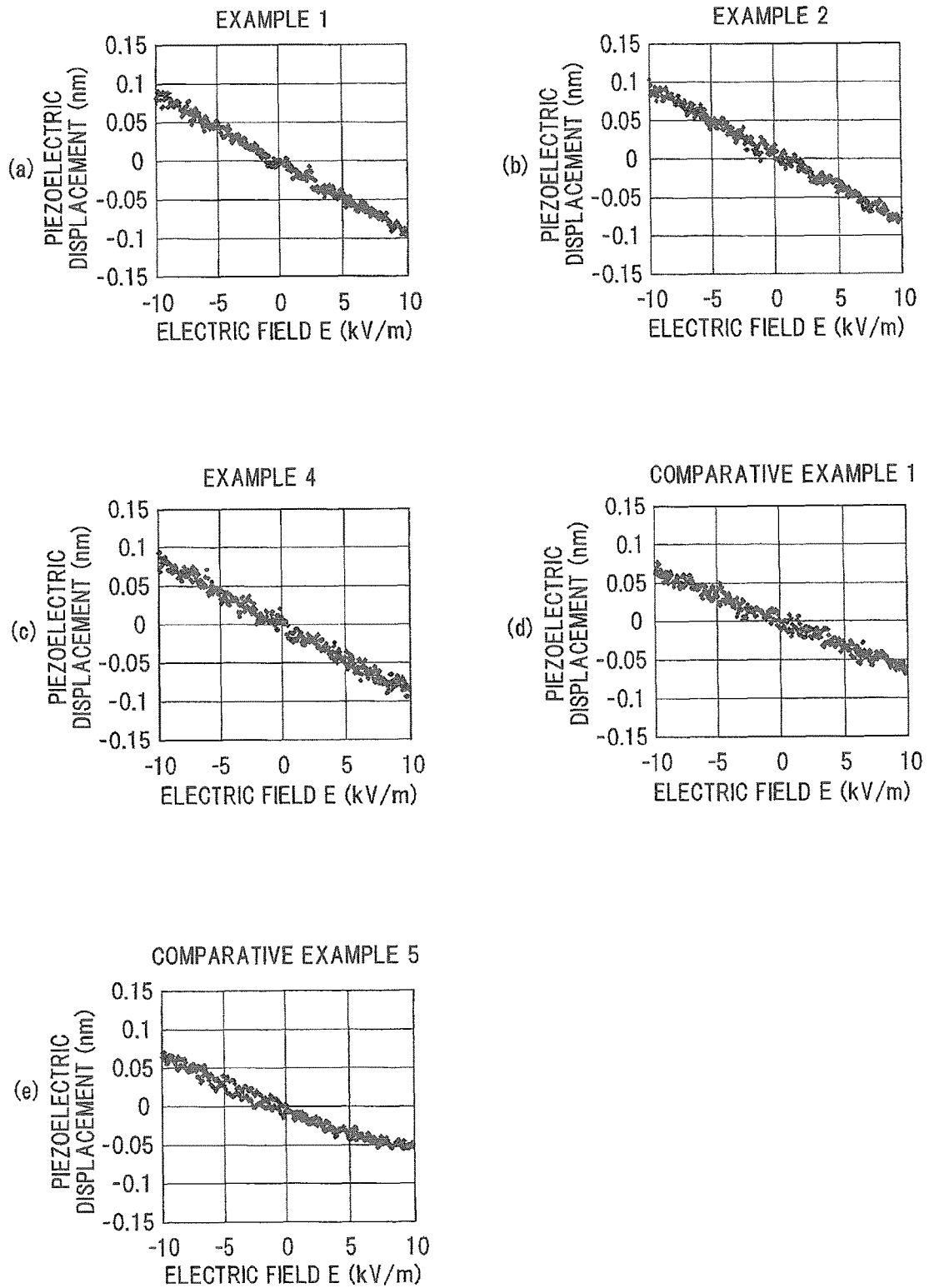
FIGS. 6A to 6E are characteristic diagrams illustrating piezoelectric displacement of the piezoelectric thin-film layer when an electric field of −10 to 10 kV/cm is applied to the piezoelectric thin-film element after polarization treatment, wherein FIGS. 6A to 6C respectively show Examples 1, 2 and 4 and FIGS. 6D and 6E respectively show Comparative Examples 1 and 5.
Figure 7:
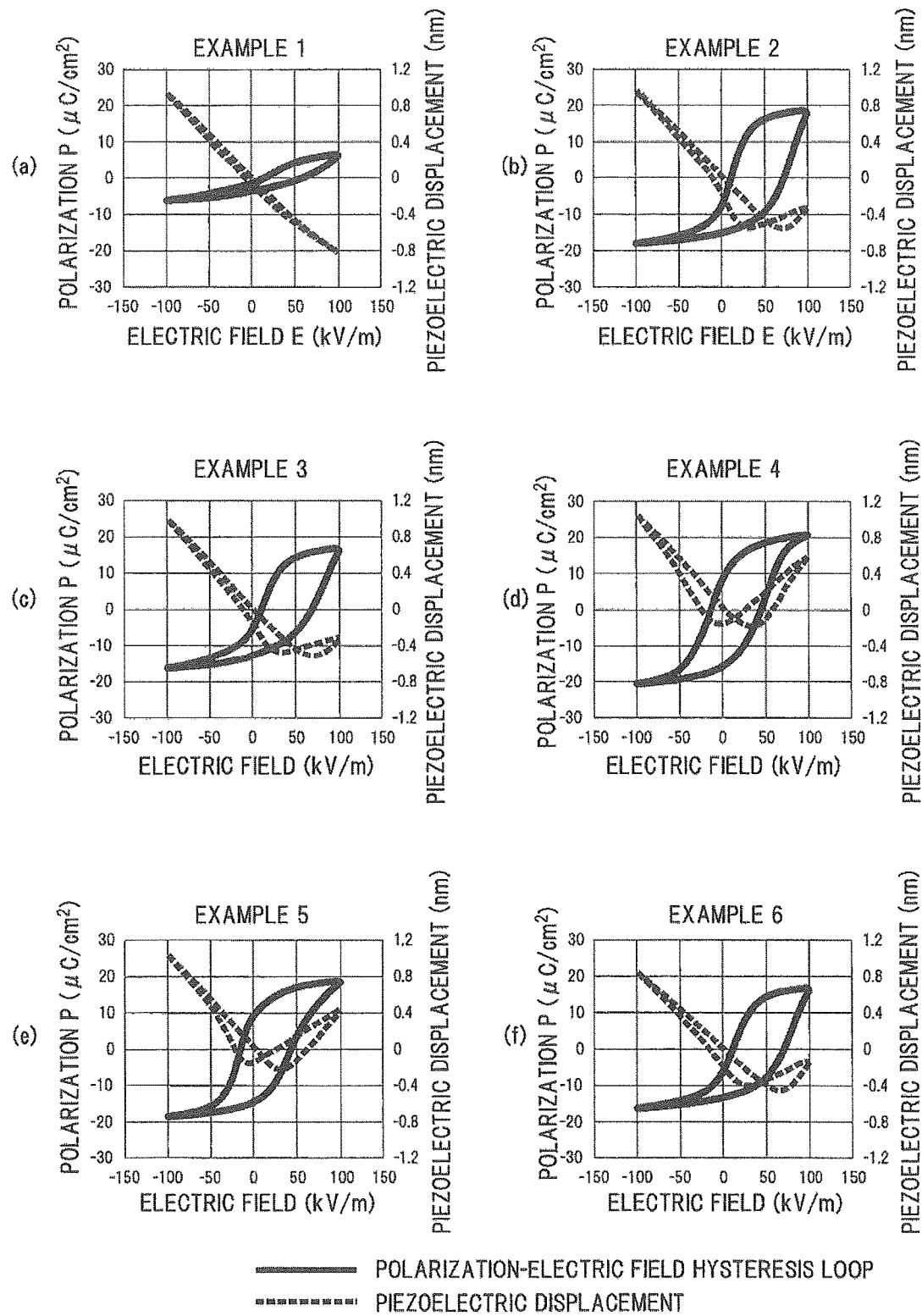
FIGS. 7A to 7I are characteristic diagrams illustrating a polarization-electric field hysteresis loop and a piezoelectric displacement in Examples 1 to 8 and 11.
Figure 7:
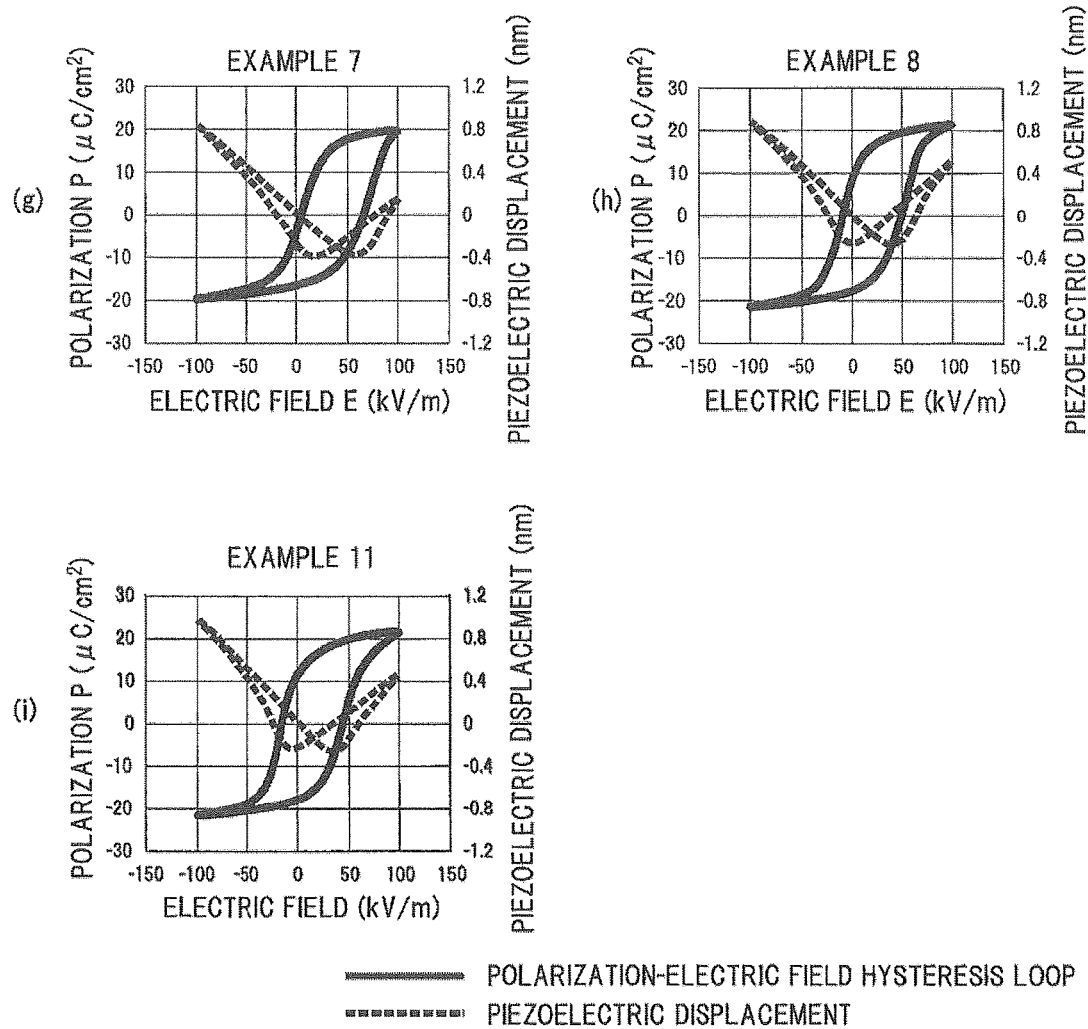
Figure 8:
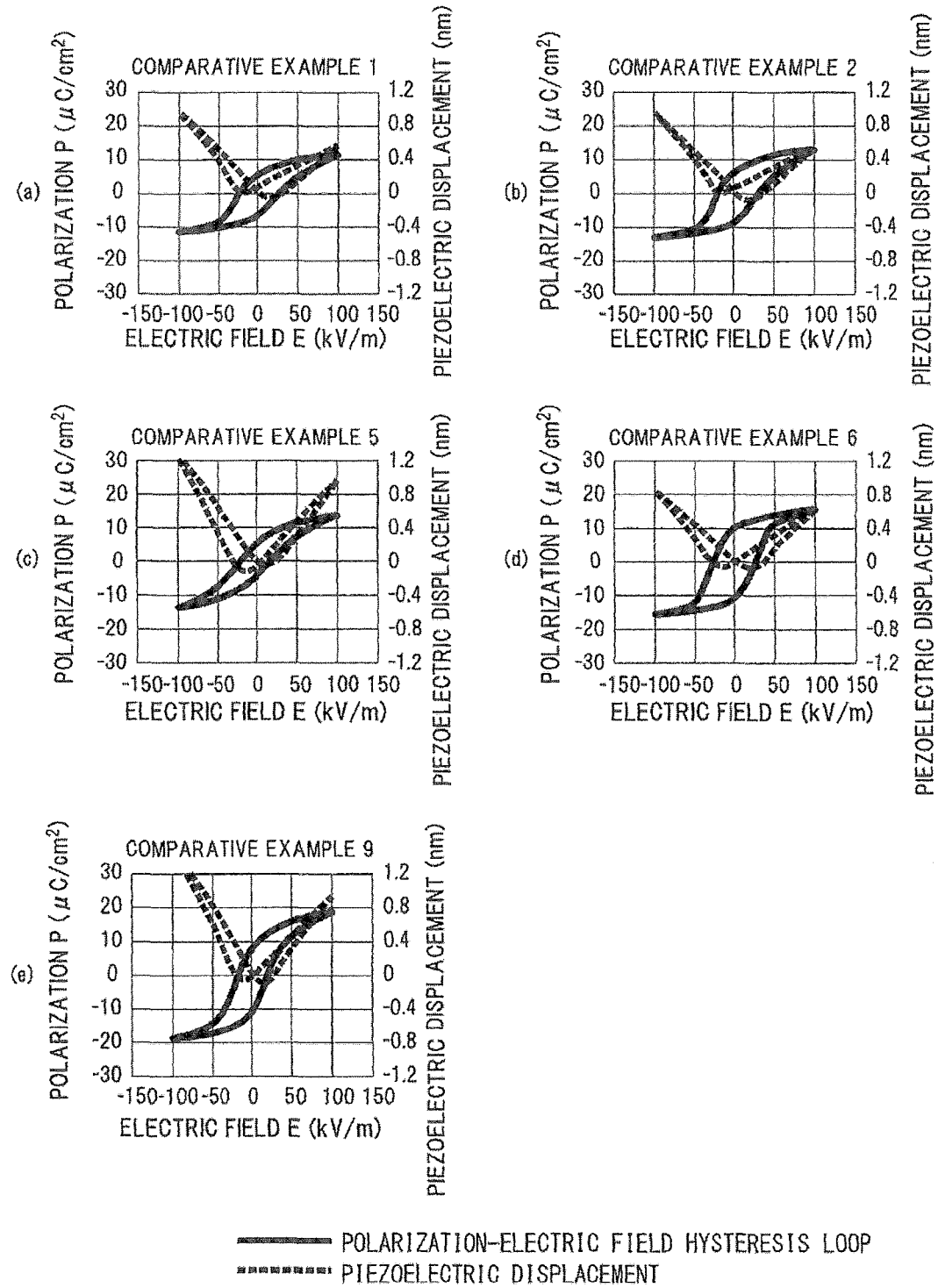
FIGS. 8A to 8E are characteristic diagrams illustrating a polarization-electric field hysteresis loop and a piezoelectric displacement in Comparative Examples 1, 2, 5, 6 and 11.

FIG. 3 is an exemplary diagram illustrating a polarization-electric field hysteresis loop. FIGS. 7A to 7I are characteristic diagrams showing the evaluation results of a polarization-electric field hysteresis loop and piezoelectric displacement in Examples 1 to 8 and 11. FIGS. 8A to 8E are characteristic diagrams showing the evaluation results of a polarization-electric field hysteresis loop and piezoelectric displacement in Comparative Examples 1, 2, 5, 6 and 9. For measuring the polarization-electric field hysteresis loop, a triangular wave or sine-wave electric field of −100 to 100 kV/cm with a frequency of 1 kHz was applied to the upper electrode layer 40 in a state that the lower electrode layer 20 is grounded. Although a TF-analyzer manufactured by aix-ACCT Systems GmbH was used for measuring the polarization-electric field hysteresis loop, it is also possible to measure the same kind of polarization-electric field hysteresis loop by a general Sawyer-Tower circuit. From the comparison between FIGS. 7 and 8, it is found that the polarization-electric field hysteresis loop in all of Examples shown in FIG. 7 is shifted toward a positive electric field direction.

Meanwhile, an electric field of −100 kV/cm was applied to the upper electrode layer 40 before measuring the relative permittivity and voltage of −1 to 1V with a frequency of 1 kHz was subsequently applied using a general LCR meter, thereby measuring relative permittivity of each sample. Note that, the Ec$^+$, Ec$^-$, Pr$^+$ and Pr$^-$ values of each sample were read at the intersection points of the measured polarization-electric field hysteresis loop and the x-axis indicating the electric field or the y-axis indicating polarization, as shown in FIG. 3.

Table 1 shows the substrate temperature, heat treatment temperature, thickness, Ec$^+$, Ec$^-$, Pr$^+$, Pr$^-$, (Ec$^+$+Ec$^-$)/2, (Pr$^+$+Pr$^-$)/2 and relative permittivity in Examples 1 to 11 and Comparative Examples 1 to 9.

It was confirmed from Table 1 that the relative permittivity of the piezoelectric thin-film layer 30 is 255 to 490, which falls within the range of not more than 490, when the value of (Ec$^-$+Ec$^+$)/2 is in a range of 10.8 to 41.8 kV/cm as well as the value of (Pr$^-$+Pr$^+$)/2 is in a range of −11.4 to −2.4 μC/cm$^2$.

On the other hand, in Comparative Examples 1 to 9, the value of (Ec$^-$+Ec$^+$)/2 is in a range of −1.5 to 5.0 kV/cm and the value of (Pr$^-$+Pr$^+$)/2 is in a range of −1.6 to 0.4 μC/cm$^2$, which are out of the range of those in Examples 1 to 11. It was confirmed that it is why the relative permittivity in Comparative Examples 1 to 9 is 520 to 1600, which is more than double the relative permittivity in Examples 1 to 11.

Here, by comparing the polarization-electric field hysteresis loop in Example 1 to that in Comparative Example 1, it was conformed that the electric field of Example 1 is shifted 35.3 kV/cm in a positive electric field direction with respect to the electric field of Comparative Example 1. It was confirmed that the relative permittivity in Comparative Example 1 is 550 and is more than the relative permittivity in Examples 1 to 11.

Evaluation of Substrate Temperature and Heat Treatment Temperature

It was confirmed from Table 1 that Examples 1 to 5, in which the piezoelectric thin-film layer 30 is formed at a substrate temperature in a range of 420 to 480° C., have a relative permittivity of 255 to 400 and thus can realize a relative permittivity of not more than 490. Note that, the substrate temperature is preferably set in a range of 420 to 440° C. since a relative permittivity of not more than 330 is obtained.

In addition, it was also confirmed that Examples 6 to 11, in which the piezoelectric thin-film layer 30 is formed at a substrate temperature in a range of 420 to 520° C. and is then subjected to heat treatment in a range of 410 to 500° C., have a relative permittivity in a range of 280 to 490 and thus can realize a relative permittivity of not more than 490.

On the other hand, it was confirmed that Comparative Examples 1 to 5, in which the piezoelectric thin-film layer 30 is formed at a substrate temperature in a range of 520 to 580° C. and is not subjected to heat treatment afterward, have an increased relative permittivity of 525 to 1600 due to the substrate temperature out of the substrate temperature range of Examples 1 to 5.

Furthermore, it was confirmed that Comparative Examples 6 to 9, in which the piezoelectric thin-film layer 30 is formed at a substrate temperature in a range of 520 to 580° C. and is then subjected to heat treatment in a range of 500 to 700° C., have an increased relative permittivity of 520 to 1200 due to either the substrate temperature or the heat treatment temperature out of the substrate temperature range or the heat treatment temperature range in Examples 6 to 11.

Evaluation of Piezoelectric Displacement

Using a double beam laser interferometer manufactured by aixACCT Systems GmbH, piezoelectric displacement of an upper electrode during electric field application was measured. Note that, it is possible to measure substantially the same piezoelectric displacement by an atomic force microscope using a conductive probe. Piezoelectric displacement in Examples 1, 2, 4 and Comparative Examples 1 and 5 was measured under the varied conditions of applying an electric field to the piezoelectric thin-film element.

(1) Applied Electric Field of −10 to 10 kV/cm

FIGS. 4A to 4E are characteristic diagrams illustrating piezoelectric displacement of a piezoelectric thin-film layer when an electric field of −10 to 10 kV/cm is applied to the piezoelectric thin-film element before polarization treatment, wherein FIGS. 4A to 4C respectively show Examples 1, 2 and 4 and FIGS. 4D and 4E respectively show Comparative Examples 1 and 5.

When an electric field of, e.g., −10 kV/cm was applied, piezoelectric displacement in Examples 1 and 2 was about 0.08 nm and that in Example 4 was about 0.05 nm. On the other hand, piezoelectric displacement in Comparative Example 1 was about −0.04 nm and that in Comparative Example 5 was about 0.03 nm. It was thus confirmed that piezoelectric displacement occurring in Examples 1, 2 and 4 is larger than that in Comparative Examples 1 and 5.

In addition, it was also confirmed that piezoelectric displacement in Examples 1, 2 and 4 occurs in a direction opposite to Comparative Example 1 and in the same direction as Comparative Example 5.

(2) Applied Electric Field of −100 to 0 kV/cm

FIGS. 5A to 5E are characteristic diagrams illustrating piezoelectric displacement of the piezoelectric thin-film layer when the piezoelectric thin-film element is polarized by applying an electric field of −100 to 0 kV/cm, wherein FIGS. 5A to 5C respectively show Examples 1, 2 and 4 and FIGS. 5D and 5E respectively show Comparative Examples 1 and 5.

When polarization treatment by applying an electric field of, e.g., −100 kV/cm was performed, piezoelectric displacement was about 1.4 to 1.5 nm in Examples 1, 2, 4 and Comparative Example 1 and about 1.9 nm in Comparative Example 5, as shown in FIGS. 5A to 5E.

(3) FIGS. 6A to 6E are characteristic diagrams illustrating piezoelectric displacement of the piezoelectric thin-film layer when an electric field of −10 to 10 kV/cm is applied after applying the electric field of −100 to 0 kV/cm, wherein FIGS. 6A to 6C respectively show Examples 1, 2 and 4 and FIGS. 6D and 6E respectively show Comparative Examples 1 and 5.

As shown in FIGS. 6A to 6E, piezoelectric displacement in Comparative Example 1 after polarization treatment was shifted in a direction different from that before polarization treatment shown in FIGS. 4A to 4E and this shows that sufficient piezoelectric displacement is not obtained when polarization treatment is not performed. On the other hand, in Examples 1, 2 and 4, displacement equivalent to prior to polarization treatment shown in FIGS. 4A to 4E was obtained after polarization treatment. As such, piezoelectric properties similar to the piezoelectric displacement after polarization treatment shown in FIGS. 6A to 6E were obtained in Examples 1, 2 and 4 and it was thus confirmed that it is possible to obtain large piezoelectric displacement without polarization.

It was also confirmed from other Examples that it is possible to obtain sufficient piezoelectric displacement without polarization treatment.

Modification

It should be noted that the embodiment and Examples of the invention are not limited to the embodiment and Examples described above and various modifications and changes can be made without departing from the gist of the invention. For example, equivalent results are obtained when using an SOI substrate in place of the Si substrate.

TABLE 1

| Samples | Substrate temperature (° C.) | Heat treatment temperature (° C.) | Thickness (nm) | $Ec^+$ (kV/cm) | $Ec^-$ (kV/cm) | $Pr^+$ (μC/cm$^2$) | $Pr^-$ (μC/cm$^2$) | $(Ec^+ + Ec^-)/2$ (kV/cm) | $(Pr^+ + Pr^-)/2$ (μC/cm$^2$) | Relative permittivity |
|---|---|---|---|---|---|---|---|---|---|---|
| Example 1 | 420 | — | 2000 | 59.0 | 15.5 | −1.5 | −3.7 | 37.3 | −2.6 | 255 |
| Example 2 | 440 | — | 2000 | 72.5 | 11.0 | −7.8 | −15 | 41.8 | −11.4 | 300 |
| Example 3 | 440 | — | 2000 | 68.5 | 10.5 | −5.5 | −12.7 | 39.5 | −9.1 | 330 |
| Example 4 | 480 | — | 2000 | 43.5 | −15.0 | 11.2 | −17.8 | 14.3 | −3.3 | 360 |
| Example 5 | 480 | — | 2000 | 43.0 | −14.5 | 8.9 | −14.5 | 14.3 | −2.8 | 400 |
| Example 6 | 420 | 500 | 2000 | 70.5 | 11.5 | −6.3 | −13.2 | 41.0 | −9.8 | 280 |
| Example 7 | 440 | 500 | 2000 | 65.5 | 5.0 | −4.3 | −16.4 | 35.3 | −10.4 | 305 |
| Example 8 | 480 | 500 | 2000 | 49.5 | −9.0 | 8.1 | −17.6 | 20.3 | −4.8 | 360 |
| Example 9 | 520 | 410 | 2000 | 41.0 | −16.5 | 7.0 | −12.4 | 12.3 | −2.7 | 450 |
| Example 10 | 520 | 450 | 2000 | 39.0 | −15.5 | 7.1 | −12.2 | 11.8 | −2.6 | 460 |
| Example 11 | 520 | 500 | 2000 | 39.0 | −17.5 | 7.3 | −12 | 10.8 | −2.4 | 490 |
| Comparative Ex. 1 | 520 | — | 2000 | 27.0 | −23.0 | 5.5 | −6.5 | 2.0 | −0.5 | 550 |
| Comparative Ex. 2 | 520 | — | 2000 | 30.0 | −21.0 | 6.0 | −8.7 | 4.5 | −1.4 | 850 |
| Comparative Ex. 3 | 540 | — | 2000 | 23.0 | −25.5 | 5.9 | −7.1 | −1.0 | −0.6 | 525 |
| Comparative Ex. 4 | 560 | — | 2000 | 22.0 | −24.0 | 5.9 | −6.9 | −1.0 | −0.5 | 560 |
| Comparative Ex. 5 | 580 | — | 2000 | 17.0 | −20.0 | 5.1 | −4.4 | −1.5 | 0.4 | 1600 |
| Comparative Ex. 6 | 520 | 700 | 2000 | 26.5 | −26.5 | 9.9 | −10.7 | 0.0 | −0.4 | 800 |
| Comparative Ex. 7 | 520 | 550 | 2000 | 30.5 | −20.5 | 7.1 | −10.3 | 5.0 | −1.6 | 520 |
| Comparative Ex. 8 | 520 | 600 | 2000 | 29.0 | −29.5 | 9.5 | −9.3 | −0.3 | 0.1 | 544 |
| Comparative Ex. 9 | 580 | 500 | 2000 | 21.0 | −19.0 | 5.7 | −7.6 | 1.0 | −1.0 | 1200 |

What is claimed is:

1. A piezoelectric thin-film element, comprising:
a substrate;
a lower electrode layer formed on the substrate;
a piezoelectric thin-film layer that is formed on the lower electrode layer and comprises potassium sodium niobate including a perovskite structure represented by a composition formula of $(K_{1-x}Na_x)NbO_3$ (0.4≤x≤0.7); and
an upper electrode layer formed on the piezoelectric thin-film layer,
wherein the piezoelectric thin-film layer is formed such that a value of $(Ec^-+Ec^+)/2$ is not less than 10.8 kV/cm and a value of $(Pr^-+Pr^+)/2$ is not more than −2.4 μC/cm$^2$, where $Ec^-$ and $Ec^+$ are intersection points of a polarization-electric field hysteresis loop and an x-axis indicating an electric field and Pr⁻ and Pr⁺ are intersection points of the polarization-electric field hysteresis loop and a y-axis indicating polarization.

2. The piezoelectric thin-film element according to claim 1, wherein the piezoelectric thin-film layer has a relative permittivity of not more than 490.

3. The piezoelectric thin-film element according to claim 1, wherein piezoelectric displacement in the piezoelectric thin-film layer without polarization treatment occurs in a contraction direction in a case of applying a positive electric field to the upper electrode layer and occurs in an elongation direction in a case of applying a negative electric field to the upper electrode layer.

4. The piezoelectric thin-film element according to claim 1, wherein a substrate temperature during formation of the piezoelectric thin-film layer is in a range of 420° C. to 480° C.

5. The piezoelectric thin-film element according to claim 1, wherein a substrate temperature during formation of the piezoelectric thin-film layer is in a range of 420° C. to 520° C., and the formed piezoelectric thin-film layer is subjected to heat treatment at 410° C. to 500° C.

6. The piezoelectric thin-film element according to claim 1, wherein the piezoelectric thin-film layer comprises a pseudo-cubic crystal or a tetragonal crystal having a perovskite structure and preferentially oriented to a (001) plane direction, and a rate of orientation in the (001) plane direction is not less than 95%.

7. The piezoelectric thin-film element according to claim 1, wherein the piezoelectric thin-film layer is subjected to stress in a compression direction from the lower electrode layer or the substrate.

8. The piezoelectric thin-film element according to claim 1, wherein the lower electrode layer comprises Pt preferentially oriented to a (111) plane direction.

9. A piezoelectric sensor, comprising the piezoelectric thin-film element according to claim 1.

10. A vibration generator, comprising the piezoelectric thin-film element according to claim 1.

11. The piezoelectric thin-film element according to claim 1, wherein the substrate comprises a silicon-on-insulator substrate.

12. The piezoelectric thin-film element according to claim 1, wherein the substrate comprises a Si substrate including a surface oriented to a (100) plane direction.

13. The piezoelectric thin-film element according to claim 12, further comprising:
an adhesive layer disposed between the Si substrate and the lower electrode layer.

14. The piezoelectric thin-film element according to claim 13, wherein the adhesive layer comprises one of Ti, TiO, and $TiO_2$.

15. The piezoelectric thin-film element according to claim 1, wherein the lower electrode layer comprises one of Pt, Au, and Al.

16. The piezoelectric thin-film element according to claim 1, further comprising:
an adhesive layer disposed between the substrate and the lower electrode layer.

17. The piezoelectric thin-film element according to claim 16, wherein the adhesive layer comprises one of Ti, TiO, and $TiO_2$.

18. The piezoelectric thin-film element according to claim 1, wherein the upper electrode layer includes a circular electrode.

19. The piezoelectric thin-film element according to claim 18, wherein the upper electrode layer comprises one of Pt, Au, and Al.

20. The piezoelectric thin-film element according to claim 1, wherein the upper electrode layer comprises one of Pt, Au, and Al.

* * * * *